(12) United States Patent
Kim et al.

(10) Patent No.: US 9,966,565 B2
(45) Date of Patent: May 8, 2018

(54) ORGANIC LIGHT-EMITTING DISPLAY APPARATUS

(71) Applicant: SAMSUNG DISPLAY CO., LTD., Yongin-si, Gyeonggi-Do (KR)

(72) Inventors: Sangki Kim, Yongin-si (KR); Deukjong Kim, Yongin-si (KR); Donghyun Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days. days.

(21) Appl. No.: 15/402,290

(22) Filed: Jan. 10, 2017

(65) Prior Publication Data

US 2017/0279079 A1 Sep. 28, 2017

(30) Foreign Application Priority Data

Mar. 24, 2016 (KR) ........................ 10-2016-0035547

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01); *H01L 27/3258* (2013.01); *H01L 51/5228* (2013.01); *H01L 51/5237* (2013.01)

(58) Field of Classification Search
CPC ............. H01L 51/2553; H01L 51/5258; H01L 51/5237
See application file for complete search history.

(56) References Cited

U.S. PATENT DOCUMENTS

| | | |
|---|---|---|
| 8,084,772 B2 | 12/2011 | Eom et al. |
| 8,492,974 B2 | 7/2013 | Lee et al. |
| 2012/0161197 A1 | 6/2012 | Im et al. |
| 2015/0034921 A1 | 2/2015 | Kim |
| 2015/0228927 A1 | 8/2015 | Kim |
| 2015/0357396 A1 | 12/2015 | Han |

FOREIGN PATENT DOCUMENTS

| | | |
|---|---|---|
| KR | 1020100034876 | 4/2010 |
| KR | 1020120057286 | 6/2012 |
| KR | 1020120071962 | 7/2012 |
| KR | 1020150016784 | 2/2015 |
| KR | 1020150094950 | 8/2015 |
| KR | 1020150141274 | 12/2015 |

*Primary Examiner* — Douglas Menz
(74) *Attorney, Agent, or Firm* — F. Chau & Associates, LLC

(57) ABSTRACT

An organic light-emitting display apparatus including a substrate having a display area and a peripheral area outside the display area, a first insulating layer arranged over the substrate throughout the display area and the peripheral area, the first insulating layer including a first opening disposed in the peripheral area, a first electrode arranged over the first insulating layer in the display area, a pixel defining film arranged over the first insulating layer, the pixel defining film including a second opening exposing a portion of the first electrode and a third opening formed at the location of the first opening to form a common opening, an intermediate layer arranged over the first electrode, and a second electrode covering the intermediate layer, the pixel defining film, at least a portion of the third opening, and at least a portion of the first opening.

23 Claims, 8 Drawing Sheets

ORGANIC LIGHT-EMITTING DISPLAY APPARATUS

CROSS-REFERENCE TO RELATED APPLICATION

This application claims the benefit of Korean Patent Application No. 10-2016-0035547 filed on Mar. 24, 2016 in the Korean Intellectual Property Office, the disclosure of which is incorporated by reference herein in its entirety.

TECHNICAL FIELD

The described technology relates to an organic light-emitting display apparatus.

DISCUSSION OF RELATED ART

An organic light-emitting display (OLED) apparatus is a self-emission display apparatus. An OLED apparatus includes a plurality of organic light-emitting devices. Each of the plurality of organic light-emitting devices includes a hole injection electrode, an electron injection electrode, and an organic emission layer disposed there between. Holes injected from the hole injection electrode recombine with electrons injected from the electron injection electrode in the organic emission layer to produce excitons. These excitons transition from an excited state to a ground state, thereby generating light.

The OLED apparatus, which is a self-emission display apparatus, requires no separate light source. Thus, the OLED apparatus may be driven at a low voltage and may be manufactured to have a light weight and a slim profile. In addition, the OLED apparatus has a wide viewing angle, a high contrast ratio, and a short response time. Accordingly, the OLED apparatus is widely applied to various fields, for example, personal portable electronic devices such as MP3 players or mobile phones, televisions, and the like. Flexible OLED apparatuses, such as foldable or rollable OLED apparatuses, have also been applied to various fields.

However, impurities (e.g., gas or moisture), which are introduced from the outside or are generated in an organic material or the like included in the OLED apparatus, may permeate the OLED apparatus and cause a deterioration in image quality during a manufacturing process or during use.

SUMMARY

One or more embodiments of the present invention include an organic light-emitting display apparatus capable of preventing or reducing deterioration in image quality.

Exemplary embodiments of the present invention provide an organic-light emitting display apparatus. The organic light-emitting display apparatus includes a substrate, a first insulating layer, a first electrode, a pixel defining layer, an intermediate layer, and a second electrode. The substrate includes a display area and a peripheral area. The peripheral area is outside the display area. The first insulating layer is arranged over the substrate throughout the display area and peripheral area. The first insulating layer includes a first opening disposed in the peripheral area. The first electrode is arranged over the first insulating layer in the display area. The pixel defining film is arranged over the first insulating layer. The pixel defining film includes a second opening exposing a portion of the first electrode. The pixel defining layer further includes a third opening formed at the location of the first opening to form a common opening. The intermediate layer is arranged over the first electrode. The second electrode covers the intermediate layer, the pixel defining film, at least a portion of the third opening, and at least a portion of the first opening.

The organic light-emitting display apparatus may further include a conductive layer. The conductive layer may be arranged over the first insulating layer in the peripheral area. The conductive layer may cover the first opening.

The pixel defining film may include a plurality of fourth openings. The plurality of fourth openings may be over at least a portion of the conductive layer.

The second electrode may contact the conductive layer through the plurality of fourth openings.

The pixel defining film may be divided into a plurality of areas by the plurality of fourth openings.

The conductive layer may include a plurality of fifth openings. The plurality of fifth openings may be disposed around the first opening.

The second electrode may directly contact the conductive layer disposed in the first opening.

A width of the third opening may be greater than a width of the first opening.

The organic light-emitting display apparatus may further include a second insulating layer. The second insulating layer may be arranged below the first insulating layer. The second insulating layer may include an inorganic material. The first opening may extend to the second insulating layer.

The second electrode may completely cover the third opening and the first opening.

The first opening may surround the display area.

The first insulating layer may be divided into a first area and a second area by the first opening.

The pixel defining film may be divided into at least two areas by the third opening.

The first opening may form a closed loop. The second electrode may completely cover the first opening.

An edge of the second electrode may be outside the first opening with respect to the display area. A distance between the edge of the second electrode and the first opening in an area corresponding to a corner of the display area may be less than a distance between the edge of the second electrode and the first opening in an area except for the area corresponding to the corner of the display area.

The closed loop may include an area recessed toward the display area in an area corresponding to a corner of the display area.

The second electrode may include an area protruding in a direction away from the display area in an area corresponding to a corner of the display area.

The organic-light emitting display device may further include a capping layer. The capping layer may be arranged over the second electrode. The capping layer may cover the first opening.

The capping layer may be separated from the pixel defining film in the third opening by the second electrode.

Each of the first insulating layer, the pixel defining film, and the capping layer may include an organic material.

The organic light-emitting display apparatus may further include an encapsulating layer. The encapsulating layer may be arranged over the capping layer. The encapsulating layer may include at least one inorganic layer and at least one organic layer.

The first insulating layer may include at least two first openings.

The first insulating layer may include a first area, a second area, and a third area. The first area, second area, and third area may be separated from one another by the at least two first openings.

BRIEF DESCRIPTION OF THE DRAWINGS

These and/or other aspects will become apparent and more readily appreciated from the following description of the embodiments of the present invention, taken in conjunction with the accompanying drawings, in which.

DETAILED DESCRIPTION OF THE EMBODIMENTS

Figure 1:
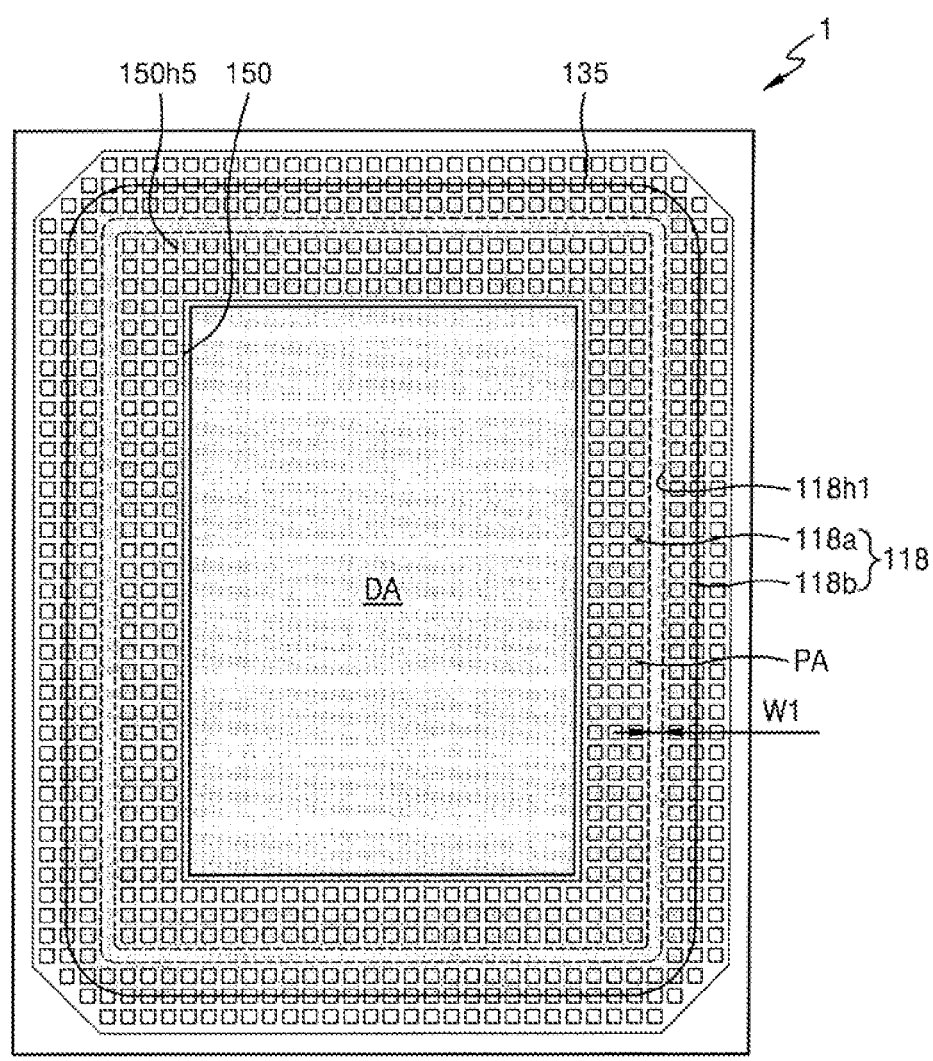
FIG. 1 is a schematic plan view illustrating an organic light-emitting display apparatus according to an exemplary embodiment of the present invention.

Reference will now be made in detail to exemplary embodiments of the present invention, examples of which are illustrated in the accompanying drawings, wherein like reference numerals refer to like elements throughout. The embodiments of the present invention may have different forms and should not be construed as being limited to the descriptions set forth herein. Accordingly, the embodiments of the present invention are merely described below, by referring to the figures, to explain aspects of the present description. As used herein, the term "and/or" includes any and all combinations of one or more of the associated listed items.

Hereinafter, embodiments of the present invention will be described in detail with reference to the accompanying drawings. Like reference numerals are assigned to like elements throughout the drawings and the specification, and redundant descriptions thereof may be omitted.

Sizes of elements in the drawings may be exaggerated for convenience of explanation. Since sizes and thicknesses of components in the drawings are arbitrarily illustrated for convenience of explanation, the following exemplary embodiments of the present invention are not limited thereto.

Figure 2:
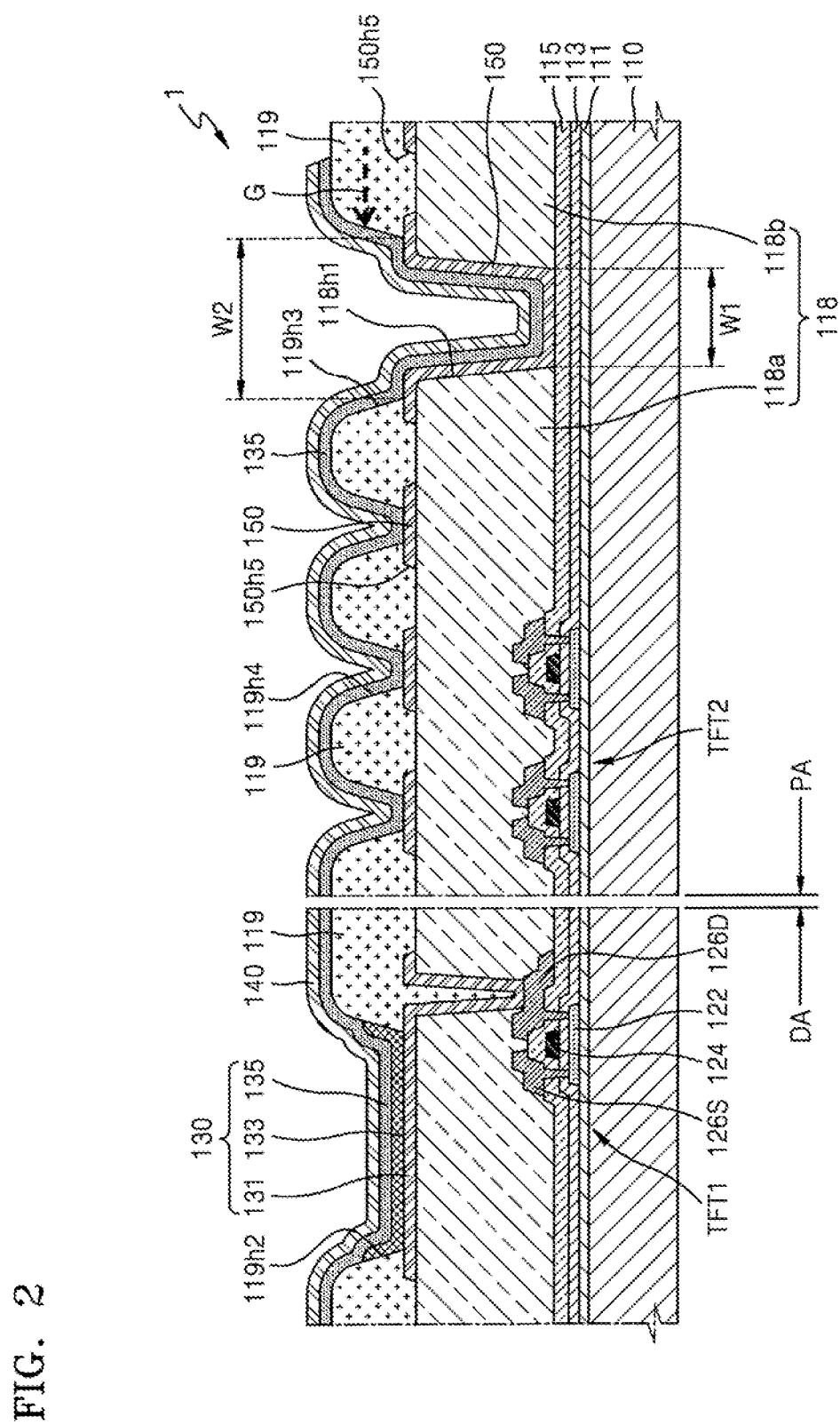
FIG. 2 is a schematic cross-sectional view illustrating an organic light-emitting display apparatus of FIG. 1 according to an exemplary embodiment of the present invention.

FIG. 1 is a schematic plan view illustrating an organic light-emitting display apparatus 1 according to an exemplary embodiment of the present invention. FIG. 2 is a schematic cross-sectional view illustrating an organic light-emitting display apparatus 1 of FIG. 1 according to an exemplary embodiment of the present invention.

Referring to FIGS. 1 and 2, the organic light-emitting display apparatus 1 may include a substrate 110. The substrate 100 may include a display area DA and a peripheral area PA. The peripheral area PA may be located outside the display area DA. The peripheral area PA may be a non-display area. The substrate 110 may include various materials, such as a glass material, a metal material, or a plastic material. According to an embodiment of the present invention, the substrate 110 may be a flexible substrate. For example, the substrate 110 may include a polymer resin, such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The display area DA of the substrate 110 may be an area where an image is displayed. A plurality of thin film transistors TFT1 may be disposed in the display area DA. A plurality of organic light-emitting devices 130 may also be disposed in the display area DA. The plurality of organic light-emitting devices 130 may be electrically connected to the plurality of thin film transistors TFT1. The electrical connection of the plurality of organic light-emitting devices 130 to the plurality of thin film transistors TFT1 may be an electrical connection of a plurality of first electrodes 131 to the plurality of thin film transistors TFT1. A plurality of thin film transistors TFT2 may be disposed in the peripheral area PA of the substrate 110. The plurality of thin film transistors TFT2 may include, for example, a part of a circuitry configured to control electrical signals to be applied to the display area DA.

Each of the thin film transistors TFT1 may include a semiconductor layer 122, a gate electrode 124, a source electrode 126S, and a drain electrode 126D. The semiconductor layer 122 may include amorphous silicon (a-Si), polycrystalline silicon (poly-Si), or an organic semiconductor material. The gate electrode 124 may be arranged over the semiconductor layer 122. The source electrode 126S and the drain electrode 126D may be electrically connected to each other according to a signal applied to the gate electrode 124. The gate electrode 124 may include a single-layered structure or a multi-layered structure including one or more materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

To electrically insulate the semiconductor layer 122 and the gate electrode 124, a gate insulating film 113 may be disposed between the semiconductor layer 122 and the gate electrode 124. The gate insulating film 113 may include an inorganic material, such as silicon oxide, silicon nitride, and/or silicon oxynitride. A second insulating layer 115 may be arranged over the gate electrode 124. The second insulating layer 115 may include an inorganic material, such as silicon oxide, silicon nitride, and/or silicon oxynitride. The source electrode 126S and the drain electrode 126D may be arranged over the second insulating layer 115. The source electrode 126S and the drain electrode 126D may be electrically connected to the semiconductor layer 122 through contact holes formed in the second insulating layer 115 and the gate insulating film 113.

The source electrode 126S and the drain electrode 126D may include a single-layered structure or a multi-layered structure. The source electrode 126S and the drain electrode 126D may include one or more materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The second insulating layer 115 including the inorganic material may be formed through chemical vapor deposition (CVD) or atomic layer deposition (ALD).

A buffer layer 111 may be disposed between the thin film transistor TFT1 and the substrate 110. The buffer layer 111 may include an inorganic material, such as silicon oxide, silicon nitride, and/or silicon oxynitride. The buffer layer 111 may increase a flatness of the upper surface of the substrate 110. The buffer layer 111 may also prevent or reduce the permeation of impurities from the substrate 110 or the like into the semiconductor layer 122 of the thin film transistor TFT1.

A first insulating layer 118 may be arranged over the thin film transistor TFT1. For example, when the organic light-emitting device 130 is arranged over the thin film transistor TFT1, the first insulating layer 118 may have a substantially flat upper surface so that the first electrode 131 may be formed to be substantially flat. The first insulating layer 118 may include an organic material, such as acryl, benzocyclobutene (BCB), polyimide (PI), or hexamethyldisiloxane (HMDSO). Referring to FIG. 2, the first insulating layer 118 may include a single-layered structure; however, embodiments of the present invention are not limited thereto. For example, the first insulating layer 118 may include a multi-layered structure. The first insulating layer 118 may be arranged over the substrate 110 throughout the display area DA and the peripheral area PA. The first insulating layer 118 may include a first opening 118$h$1 disposed in the peripheral area PA. The first insulating layer 118 may be physically divided into at least two portions by the first opening 118$h$1. As such, impurities from the outside or impurities generated in the first insulating layer 118 or the like outside the first opening 118$h$1 (e.g., gas or moisture) may be prevented from reaching the display area DA through the first insulating layer 118.

In the display area DA of the substrate 110, the organic light-emitting device 130 may be arranged over the first insulating layer 118. The organic light-emitting device 130 may include a first electrode 131, a second electrode 135, and an intermediate layer 133 disposed between the first electrode 131 and the second electrode 135. The intermediate layer 133 may include an emission layer.

The first insulating layer 118 may include an opening. The opening may expose one of the source electrode 126S and the drain electrode 126D of the thin film transistor TFT1. The first electrode 131 may contact one of the source electrode 126S and the drain electrode 126D through the opening. The first electrode 131 may be electrically connected to the thin film transistor TFT1.

The first electrode 131 may be a translucent electrode or a transparent electrode. Alternatively, the first electrode 131 may be a reflective electrode. When the first electrode 131 is a translucent electrode or a transparent electrode, the first electrode 131 may include a transparent conductive layer. The transparent conductive layer may include at least one or more materials selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The first electrode 131 may further include a translucent layer, which may increase light efficiency of the organic light-emitting display apparatus 1.

The translucent layer may be a thin film having a thickness of several nanometers to tens of nanometers. The translucent layer may include at least one or more materials selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and ytterbium (Yb). When the first electrode 131 is a reflective electrode, the first electrode 131 may include a reflective film and a transparent conductive layer. The reflective film may include silver (Ag), magnesium (Mg), aluminum (Al), platinum (Pt), palladium (Pd), gold (Au), nickel (Ni), neodymium (Nd), iridium (Ir), chromium (Cr), or compounds thereof. The transparent conductive layer may be arranged over and/or below the reflective film. The transparent conductive layer may be at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). However, embodiments of the present invention are not limited thereto. The first electrode 131 may include various materials. The first electrode 131 may include a single-layered structure or a multi-layered structure.

A pixel defining film 119 may be arranged over the first insulating layer 118 throughout the display area DA and the peripheral area PA. The pixel defining film 119 may define a pixel by including an opening corresponding to each sub-pixel. For example, a second opening 119$h$2 may expose a central portion of at least the first electrode 131. The pixel defining film 119 may increase a distance between an edge of the first electrode 131 and the second electrode 135 arranged over the first electrode 131. Therefore, an arc may be prevented from occurring at the edge of the first electrode 131. The pixel defining film 119 may include an organic material, such as polyimide (PI) or hexamethyldisiloxane (HMDSO). The pixel defining film 119 may include a third opening 119$h$3. The third opening 119$h$3 may expose the first opening 118$h$1 of the first insulating layer 118 in the peripheral area PA. Similar to the first opening 118$h$1, the third opening 119$h$3 may prevent impurities (e.g., gas or moisture) from the outside or generated in the pixel defining film 119 outside the first opening 118$h$1 from permeating and reaching the display area DA through the pixel defining film 119. The first insulating layer 118 and the pixel defining film 119 may include substantially the same organic material, however, embodiments of the present invention are not limited thereto.

The intermediate layer 133 of the organic light-emitting device 130 may include a low-molecular-weight material or a high-molecular-weight material. When the intermediate layer 133 includes a low-molecular-weight material, the intermediate layer 133 may include a single-layered structure or a multi-layered structure. The multi-layered structure may include a hole injection layer (HIL), a hole transport layer (HTL), an emission layer (EML), an electron transport layer (ETL), and an electron injection layer (EIL). The intermediate layer 133 may include various organic materials, such as copper phthalocyanine (CuPc), N,N'-di(naphthalene-1-yl)-N,N'-diphenyl-benzidine (NPB), or tris-8-hydroxyquinoline aluminum (Alq3). Layers of the multi-layered structure may be formed by vacuum deposition. When the intermediate layer 133 includes a high-molecular-weight material, the intermediate layer 133 may include a structure including a hole transport layer (HTL) and an emission layer (EML). The hole transport layer (HTL) may include poly(3,4-ethylenedioxythiophene) (PEDOT). The emission layer (EML) may include a poly-phenylenevinylene (PPV)-based polymer or a polyfluorene (PFO)-based polymer. The intermediate layer 133 may be formed by screen printing, inkjet printing, or laser induced thermal imaging (LITI).

However, the intermediate layer 133 is not limited thereto. The intermediate layer 133 may include various structures. The intermediate layer 133 may include an integrated layer throughout the plurality of first electrodes 131. The intermediate layer 133 may also include layers patterned corresponding to the plurality of first electrodes 131.

The second electrode 135 may be disposed throughout the display area DA and the peripheral area PA. The second electrode 135 may be arranged over the intermediate layer 133 and the pixel defining film 119 disposed inside the third opening 119$h$3 of the pixel defining film 119. The second electrode may also be disposed inside the first opening 118$h$1 of the first insulating layer 118. The second electrode 135 may be integrally formed with respect to the plurality of organic light-emitting devices 130. The second electrode 135 may correspond to the plurality of first electrodes 131.

The second electrode 135 may be a translucent electrode or a transparent electrode. Alternatively, the second electrode 135 may be a reflective electrode. When the second electrode 135 is a translucent electrode or a transparent electrode, the second electrode 135 may include one or more materials selected from the group consisting of silver (Ag), aluminum (Al), magnesium (Mg), lithium (Li), calcium (Ca), copper (Cu), lithium fluoride/calcium (LiF/Ca), lithium fluoride/aluminum (LiF/Al), silver magnesium (MgAg), and silver calcium (CaAg). The second electrode 135 may be a thin film having a thickness of several nanometers to tens of nanometers. When the second electrode 135 is a reflective electrode, the second electrode 135 may include one or more materials selected from the group consisting of silver (Ag), aluminum (Al), magnesium (Mg), lithium (Li), calcium (Ca), copper (Cu), lithium fluoride/calcium (LiF/Ca), lithium fluoride aluminum (LiF/Al), silver magnesium (MgAg), and silver calcium (CaAg). However, the structures and materials of the second electrode 135 are not limited thereto.

The first insulating layer 118 and the pixel defining film 119 may be arranged over the substrate 110 throughout the display area DA and the peripheral area PA. The first insulating layer 118 may include the first opening 118$h$1 disposed in the peripheral area PA. The pixel defining film 119 may include the third opening 119$h$3 disposed in the peripheral area PA. The second insulating layer 115 may be exposed by the first opening 118$h$1 in the first insulating layer 118. A width W2 of the third opening 119$h$3 disposed in the pixel defining film 119 may be greater than a width W1 of the first opening 118$h$1 disposed in the first insulating layer 118. Accordingly, the pixel defining film 119 might not be disposed in the first opening 118$h$1.

A conductive layer 150 may be arranged over the first insulating layer 118 in the peripheral area PA. The conductive layer 150 may also be disposed inside the first opening 118$h$1 disposed in the peripheral area PA. The conductive layer 150 may be arranged on substantially the same layer as the first electrode 131. At least a portion of the conductive layer 150 may be disposed between the first insulating layer 118 and the pixel defining film 119. The conductive layer 150 may include substantially the same material as the first electrode 131. The conductive layer 150 may completely cover the first opening 118$h$1.

According to an embodiment of the present invention, the conductive layer 150 may include a plurality of fifth openings 150$h$5. The plurality of fifth openings 150$h$5 may be disposed around the first opening 118$h$1. The pixel defining film 119 may include a plurality of fourth openings 119$h$4. The plurality of fourth openings 119$h$4 may expose at least a portion of the conductive layer 150. The pixel defining film 119 may be divided into a plurality of areas by the fourth openings 119$h$4. The plurality of fifth openings 150$h$5 of the conductive layer 150 may be arranged below the conductive layer 150. The plurality of fifth openings 150$h$5 may function as passages through which gas generated in the first insulating layer 118 including the organic material may be discharged to the outside. Therefore, a deterioration in image quality in the organic light-emitting display apparatus 1 caused by the permeation of gas generated in the first insulating layer 118 into the display area DA may be prevented or reduced.

The plurality of fourth openings 119$h$4 of the pixel defining film 119 may expose the conductive layer 150. The second electrode 135 arranged over the pixel defining film 119 may contact the conductive layer 150 through the plurality of fourth openings 119$h$4. The conductive layer 150 may be a voltage supply line for supplying a voltage to the second electrode 135. Alternatively, the conductive layer 150 may be a connection line for connecting the voltage supply line to the second electrode 135.

Referring to FIG. 1, the first opening 118$h$1 in the first insulating layer 118 may surround the display area DA. For example, the first opening 118$h$1 may form a closed loop to completely surround the display area DA. Accordingly, the first insulating layer 118 may include a first area 118$a$ and a second area 118$b$ divided by the first opening 118$h$1. Similarly, the pixel defining film 119 may be divided into at least two areas by the third opening 119$h$3 disposed corresponding to the first opening 118$h$1.

The conductive layer 150 may be disposed in the peripheral area PA to surround the display area DA. The conductive layer 150 may cover the first opening 118$h$1. The conductive layer 150 may include the plurality of fifth openings 150$h$5 disposed around the first opening 118$h$1. The second electrode 135 may be disposed throughout the display area DA and the peripheral area PA. The second electrode 135 may completely cover the first openings 118$h$1. For example, the second electrode 135 may completely cover the first opening 118$h$1 at a corner of the display area DA as well as the first openings 118$h$1 disposed around the display area DA. The second electrode 135 may directly contact the conductive layer 150 disposed in the first opening 118$h$1.

However, embodiments of the present invention are not limited to thereto. The conductive layer 150 may cover a portion of the third opening 119$h$3 and completely covering the first opening 118$h$1. The conductive layer 150 may also cover a portion of the first opening 118$h$1 and a portion of the third opening 119$h$3. However, the conductive layer 150 may cover at least a portion of the first opening 118$h$1 and at least a portion of the third opening 119$h$3 throughout an entire area surrounding the display area DA.

A capping layer 140 may be arranged over the second electrode 135. The capping layer 140 may increase light efficiency of the organic light-emitting display apparatus 1. The capping layer 140 may be disposed throughout the display area DA and the peripheral area PA. The capping layer 140 may also be disposed inside the first opening 118$h$1. The capping layer 140 may include an organic material. An encapsulating layer may be arranged over the capping layer 140. The encapsulating layer may include at least one inorganic film and at least one organic film.

Figure 3:
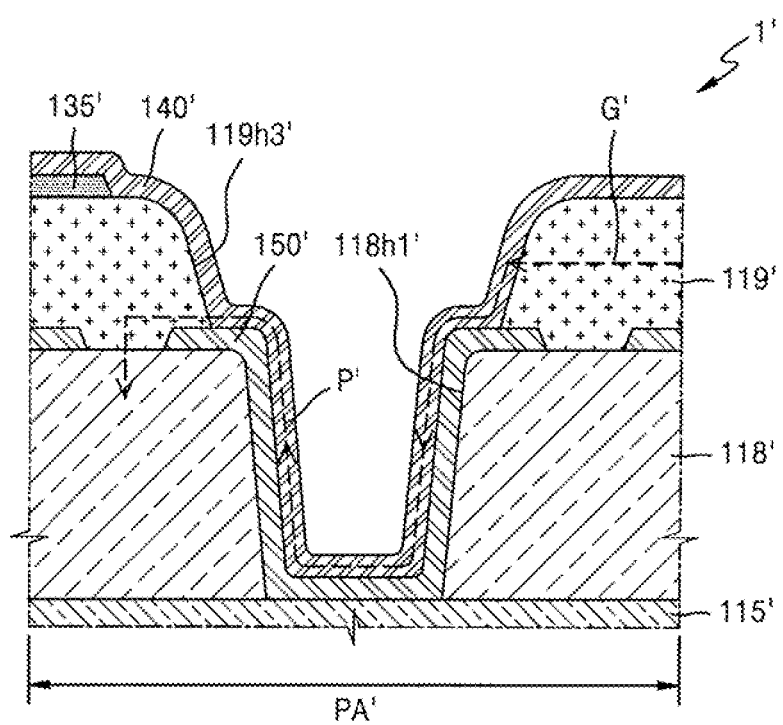
FIG. 3 is a schematic cross-sectional view illustrating an organic light-emitting display apparatus according to a comparative example.

FIG. 3 is a schematic cross-sectional view illustrating an organic light-emitting display apparatus according to a comparative example.

Referring to FIG. 3, an organic light-emitting display apparatus 1' may include a second insulating layer 115' in a peripheral area PA'. The organic light-emitting display apparatus 1' may further include a first insulating layer 118' arranged over the second insulating layer 115'. The first insulating layer 118' may include a first opening 118$h$1'. A conductive layer 150' may be disposed inside the first opening 118$h$1'. The conductive layer 150 may include a plurality of fifth openings 150$h$5'. The plurality of fifth openings 150$h$5' may be disposed around the first opening 118$h$1'.

A pixel defining film 119' may be arranged over the first insulating layer 118'. The pixel defining film 119' may cover at least a portion of the conductive layer 150'. The pixel defining film 119' may include a third opening 119$h$3'. The third opening 119$h$3' may expose the first opening 118$h$1'. A second electrode 135' and a capping layer 140' may be arranged over the pixel defining film 119'.

In the organic light-emitting display apparatus 1' according to a comparative example, the second electrode 135' might not be disposed inside the first opening 118$h$1'. The capping layer 140' may extend from an upper side of the second electrode 135'. The capping layer 140' may cover the first opening 118$h$1'. Each of the first insulating layer 118', the pixel defining film 119', and the capping layer 140' may include an organic material. Accordingly, impurities G' (e.g., gas or moisture), which are introduced from the outside or generated in the pixel defining film 119', may permeate along a passage P' and penetrate the display area DA along the first insulating layer 118'. The impurities G' (e.g., gas or moisture), which may permeate into the display area DA, may penetrate an intermediate layer 133 including an emission layer. As such, the impurities G' may cause deterioration in image quality in the organic light-emitting display apparatus 1'.

Referring to FIG. 2, the second electrode 135 may be disposed inside the first opening 118$h$1. Due to the second electrode 135, the pixel defining film 119 and the capping layer 140 may be completely separated from each other in the first opening 118$h$1 and the third opening 119$h$3. Accordingly, since the impurities G (e.g., gas or moisture), which may be introduced from the outside through the first insulating layer 118 or the pixel defining film 119 or that are generated in the pixel defining film 119 may be blocked by the second electrode 135, the impurities G may not permeate the display area DA. In addition, the impurities G (e.g., gas or moisture), which are introduced through the capping layer 140, may be blocked by the second electrode 135 and therefore might not penetrate the intermediate layer 133. Accordingly, deterioration in image quality in the organic light-emitting display apparatus 1 may be prevented or reduced.

Figure 4:
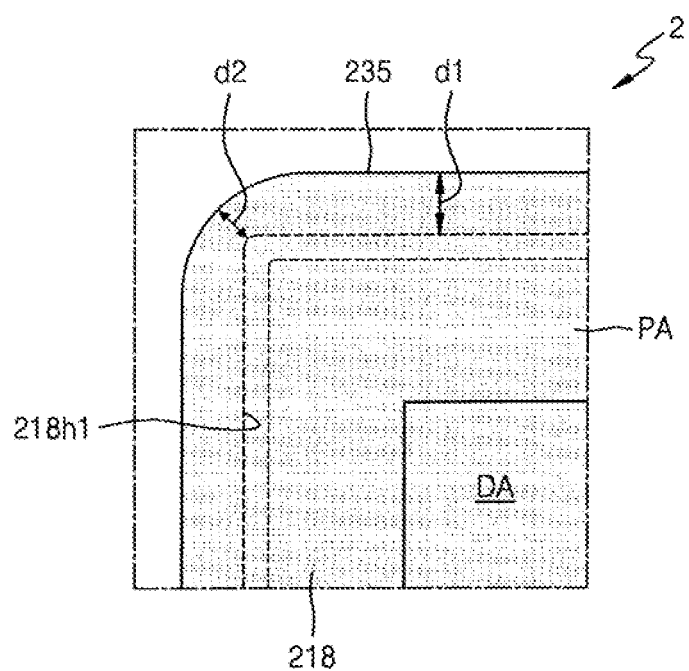
FIG. 4 is a schematic plan view illustrating an organic light-emitting display apparatus according to an exemplary embodiment of the present invention.
Figure 5:
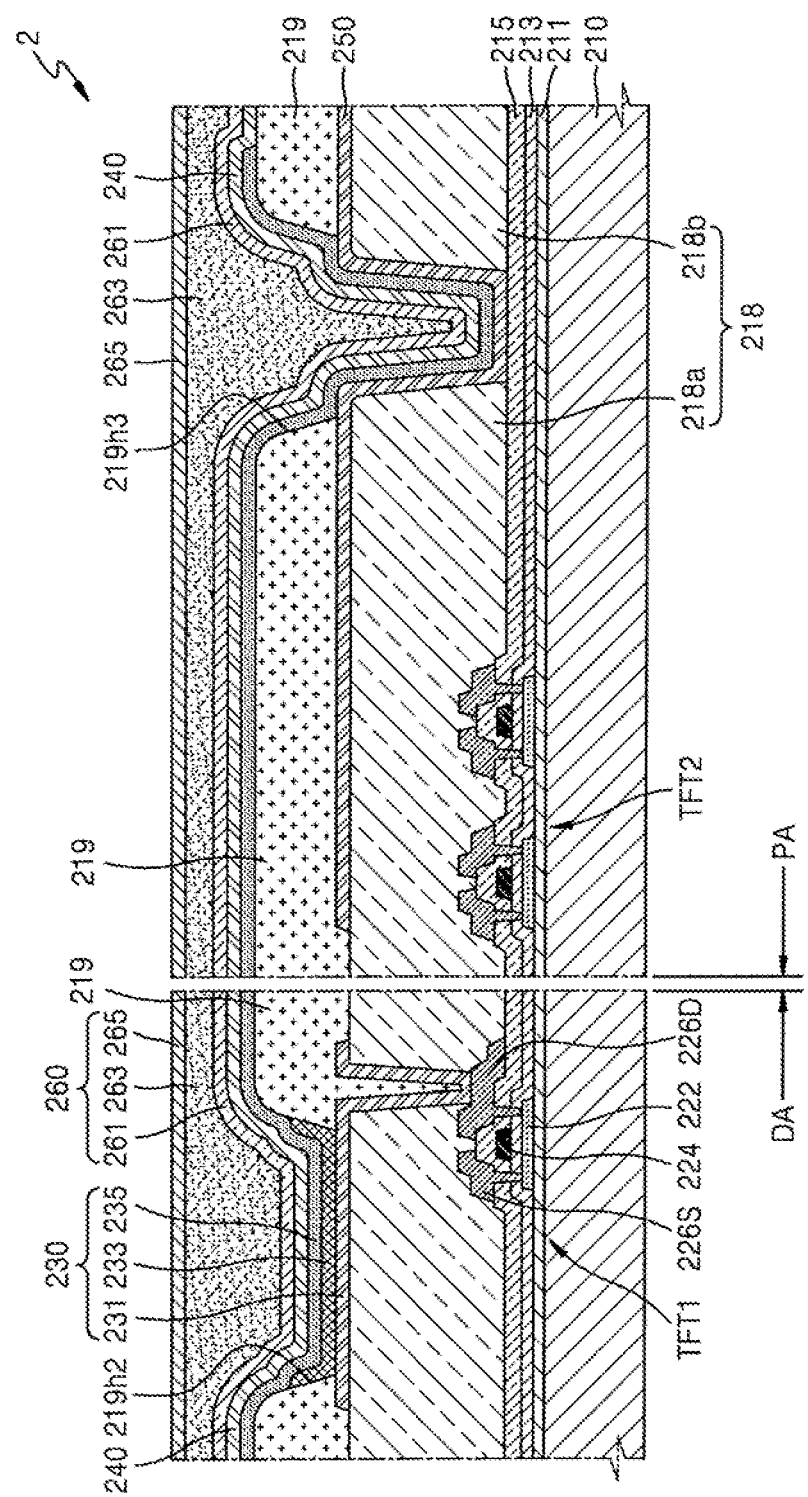
FIG. 5 is a schematic cross-sectional view illustrating an organic light-emitting display apparatus of FIG. 4 according to an exemplary embodiment of the present invention.

FIG. 4 is a schematic plan view illustrating an organic light-emitting display apparatus 2 according to an exemplary embodiment of the present invention. FIG. 5 is a schematic cross-sectional view illustrating an organic light-emitting display apparatus 2 of FIG. 4 according to an exemplary embodiment of the present invention.

Referring to FIGS. 4 and 5, the organic light-emitting display apparatus 2 may include a substrate 210, a first insulating layer 218, a first electrode 231, a pixel defining film 219, an intermediate layer 233, and a second electrode 235. The substrate 210 may include a display area DA and a peripheral area PA. The peripheral area PA may be outside the display area DA. The first insulating layer 218 may be arranged over the substrate 210 throughout the display area DA and the peripheral area PA. The first insulating layer 218 may include a first opening 218$h$1. The first opening 218$h$1 may be disposed in the peripheral area PA. The first electrode 231 may be arranged over the first insulating layer 218 in the display area DA. The pixel defining film 219 may be arranged over the first insulating layer 218 throughout the display area DA and the peripheral area PA. The pixel defining film 219 may include a second opening 219$h$2. The second opening 219$h$2 may expose a central portion of the first electrode 231. The pixel defining film may further include a third opening 219$h$3 in which the first opening 218$h$1 may be disposed. The intermediate layer 233 may be arranged over the first electrode 231. The second electrode 235 may cover the intermediate layer 233, the pixel defining film 219, the third opening 219$h$3, and the first opening 218$h$1.

A buffer layer 211 may be arranged over the substrate 210. A thin film transistor TFT1 and an organic light-emitting device 230 may be arranged over the buffer layer 211 in the display area DA. The organic light-emitting device 230 may be electrically connected to the thin film transistor TFT1. The organic light-emitting device 230 may include a first electrode 231, an intermediate layer 233, and a second electrode 235. The intermediate layer 233 may include an emission layer.

The thin film transistor TFT1 may include a semiconductor layer 222, a gate electrode 224, a source electrode 226S, and a drain electrode 226D. A gate insulating film 213 may be disposed between the semiconductor layer 222 and the gate electrode 224. A second insulating layer 215 may be arranged over the gate electrode 224. The gate insulating film 213 and the second insulating layer 215 may include an inorganic material. The gate insulating film 213 and the second insulating layer 215 may be disposed throughout the display area DA and the peripheral area PA.

The first insulating layer 218 may be arranged over the thin film transistor TFT1. The first insulating layer 218 may be disposed throughout the display area DA and the peripheral area PA. The first insulating layer 218 may include the first opening 218$h$1 in the peripheral area PA. The first opening 218$h$1 may expose the second insulating layer 215. The first opening 218$h$1 may form a closed loop to surround the display area DA. The first insulating layer 218 may be divided into a first area 218$a$ and a second area 218$b$ by the first opening 218$h$1. The first insulating layer 218 may include an organic material such as polyimide (PI).

The first electrode 231 may be arranged over the first insulating layer 218 in the display area DA. A conductive layer 250 may be disposed in the peripheral area PA. Dissimilar from the conductive layer 150 of FIG. 2, the conductive layer 250 of FIG. 5 might not include openings disposed around the first opening 218$h$1. The pixel defining film 219 may be arranged over the first insulating layer 218. The pixel defining film 219 may include the second opening 219$h$2. The second opening 219$h$2 may expose a central portion of the first electrode 231. The second opening 219$h$2 may also expose the third opening 219$h$3 exposing the first opening 219$h$1. The pixel defining film 219 may be disposed throughout the display area DA and the peripheral area PA. The pixel defining film 219 may cover a portion of the first electrode 231. The pixel defining film 219 may cover a portion of the conductive layer 250. The third opening 219$h$3 exposing the first opening 218$h$1 may be wider than the first opening 218$h$1 and may completely expose the first opening 218$h$1.

The intermediate layer 233 including the emission layer (EML) may be arranged over the first electrode 231. The second electrode 235 may be arranged over the intermediate layer 233. The second electrode 235 may be arranged over the intermediate layer 233 and the pixel defining film 219. The second electrode 235 may extend to the inside of the first opening 218h1. Since the pixel defining film 219 might not be disposed inside the first opening 218h1, the conductive layer 250 may contact the second electrode 235 in the first opening 219h1. The conductive layer 250 may be a voltage supply line for supplying a voltage to the second electrode 235. Alternatively, the conductive layer 250 may be a connection line for connecting the voltage supply line to the second electrode 235. The second electrode 235 may completely cover the first opening 218h1. For example, the second electrode 235 may completely cover the entire first opening 218h1 forming a closed loop. Accordingly, a passage may be blocked through which impurities (e.g., gas or moisture) introduced from the outside or generated in the organic material of the pixel defining film 219 or the like may permeate the display area DA. As illustrated in FIG. 4, an edge of the second electrode 235 may be outside the first opening 218h1 with respect to the display area DA. A distance d2 between the edge of the second electrode 235 and the first opening 218h1 in an area corresponding to a corner of the display area DA may be less than a distance d1 between the edge of the second electrode 235 and the first opening 218h1 in the remaining area. For example, an area corresponding to one side of the display area DA.

A capping layer 240 may be arranged over the second electrode 235. The capping layer 240 may include an organic material. The capping layer may increase light efficiency of the organic light-emitting display apparatus 2. An encapsulating layer 260 may be arranged over the capping layer 240. The encapsulating layer 260 may cover the organic light-emitting device 230. Accordingly, the encapsulating layer 260 may protect the organic light-emitting device 230 from external impurities (e.g., moisture or oxygen). The encapsulating layer 260 may cover the display area DA. The encapsulating layer 260 may extend to the peripheral area PA. As illustrated in FIG. 5, the encapsulating layer 260 may include a first inorganic layer 261, an organic layer 263, and a second inorganic layer 265.

The first inorganic layer 261 may cover the capping layer 240. The first inorganic layer 261 may include silicon oxide, silicon nitride, and/or silicon oxynitride. According to an embodiment of the present invention, other layers, such as a lithium fluoride (LiF) layer, may be disposed between the first inorganic layer 261 and the capping layer 240. Since the first inorganic layer 261 may be provided along an understructure thereof, an upper surface of the first inorganic layer 261 might not be substantially flat as illustrated in FIG. 5. The organic layer 263 may cover the first inorganic layer 261. An upper surface of the organic layer 263 may be substantially flat. The organic layer 263 may include one or more materials selected from polyethylene terephthalate (PET), polyethylene naphthalate (PEN), polycarbonate (PC), polyimide (PI), polyethylene sulfonate, polyoxymethylene (POM), polyarylate, and hexamethyldisiloxane (HMDSO). The second inorganic layer 265 may cover the organic layer 263. The second inorganic layer 265 may include silicon oxide, silicon nitride, and/or silicon oxynitride. The second inorganic layer 265 may contact the first inorganic layer 261 at a corner of the organic light-emitting display apparatus 2, so as not to expose the organic layer 263.

The encapsulating layer 260 may include the first inorganic layer 261, the organic layer 263, and the second inorganic layer 265. When cracks occur in the encapsulating layer 260, a multi-layered structure may prevent the cracks from being connected to each other between the first inorganic layer 261 and the organic layer 263 or between the organic layer 263 and the second inorganic layer 265. Consequently, the formation of a passage through which external moisture or oxygen may permeate the display area DA may be prevented or reduced.

Figure 6:
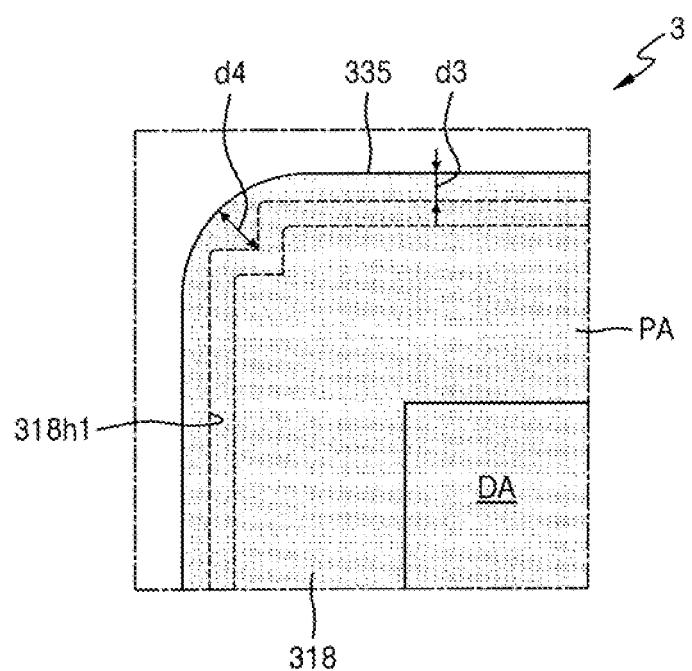
FIG. 6 is a schematic plan view illustrating an organic light-emitting display apparatus according to an exemplary embodiment of the present invention.

FIG. 6 is a schematic plan view illustrating an organic light-emitting display apparatus 3 according to an exemplary embodiment of the present invention. The configuration of the organic light-emitting display apparatus 3 of FIG. 6 may differ from the configuration of the light-emitting display apparatus 1 of FIG. 2 or the organic light-emitting display apparatus 2 of FIG. 5, except for a first insulating layer 318 and a second electrode 335.

Referring to FIG. 6, the organic light-emitting display apparatus 3 may include the first insulating layer 318 in a display area DA and a peripheral area PA. The first insulating layer 318 may include a first opening 318h1 in the peripheral area PA. The first opening 318h1 may surround the display area DA. In a plan view, the first opening 318h1 may include an area recessed in a corner. For example, the first opening 318h1 may form a closed loop to surround the display area DA. The closed loop may include an area recessed toward the display area DA. According to an embodiment of the present invention, the first opening 318h1 may include an area recessed to have an L-shape in the corner.

The second electrode 335 may completely cover the first opening 318h1. For example, an edge of the second electrode 335 may be outside the first opening 318h1 with respect to the display area DA. A distance d4 between the edge of the second electrode 335 and the first opening 318h1 in an area corresponding to a corner of the display area DA may be greater than a distance d3 between the edge of the second electrode 335 and the first opening 318h1 in the remaining area. For example, an area corresponding to one side of the display area DA.

By configuring the corner of the first opening 318h1 as described above, the second electrode 335 may be provided so the distance d3 between the edge of the second electrode 335 and the first opening 318h1 in an area except for the corner of FIG. 6 is less than the distance d1 between the edge of the second electrode 235 and the first opening 218h1 in an area except for the corner of FIG. 4. Accordingly, an area of the second electrode 335 may be minimized.

Figure 7:
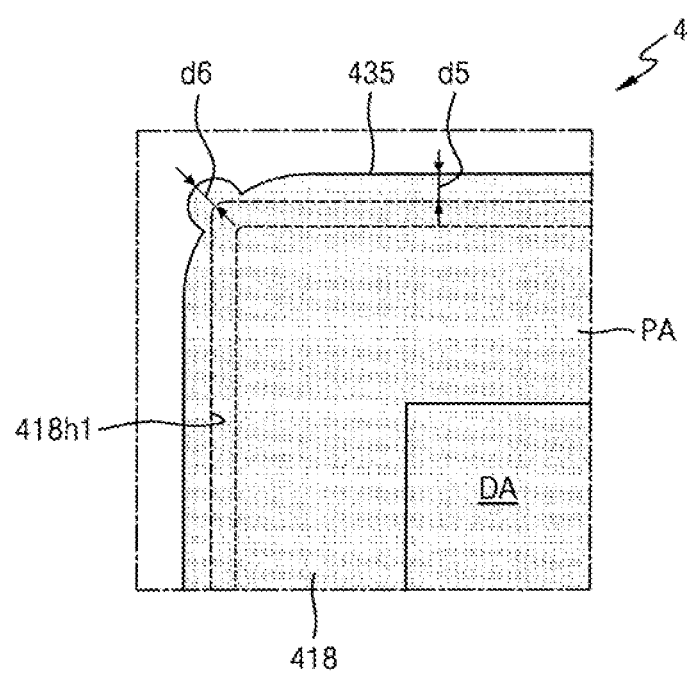
FIG. 7 is a schematic plan view illustrating an organic light-emitting display apparatus according to an exemplary embodiment of the present invention.

FIG. 7 is a schematic plan view illustrating an organic light-emitting display apparatus 4 according to an exemplary embodiment of the present invention. The configuration of the organic light-emitting display apparatus 4 of FIG. 7 differs from the configuration of the light-emitting display apparatus 1 of FIG. 2 or the organic light-emitting display apparatus 2 of FIG. 5, except for a first insulating layer 418 and a second electrode 435.

Referring to FIG. 7, the organic light-emitting display apparatus 4 may include the first insulating layer 418 in a display area DA and a peripheral area PA. The first insulating layer 418 may include a first opening 418h1 in the peripheral area PA. The first opening 418h1 may surround the display area DA. The second electrode 435 may completely cover the first opening 418h1. For example, an edge of the second electrode 435 may be outside the first opening 418h1 with respect to the display area DA. In an area corresponding to a corner of the display area DA, the second electrode 435 may include an area protruding in a direction away from the display area DA.

A distance d6 between the edge of the second electrode 435 and the first opening 418h1 in the area corresponding to the corner of the display area DA may be substantially equal to a distance d5 between the edge of the second electrode 435 and the first opening 418h1 in the remaining area. For example, an area corresponding to one side of the display area DA. However, embodiments of the present invention are not limited thereto. The distance d6 between the edge of the second electrode 435 and the first opening 418h1 in the area corresponding to the corner of the display area DA may be less than or greater than the distance d5 between the edge of the second electrode 435 and the first opening 418h1 in the remaining area.

Figure 8:
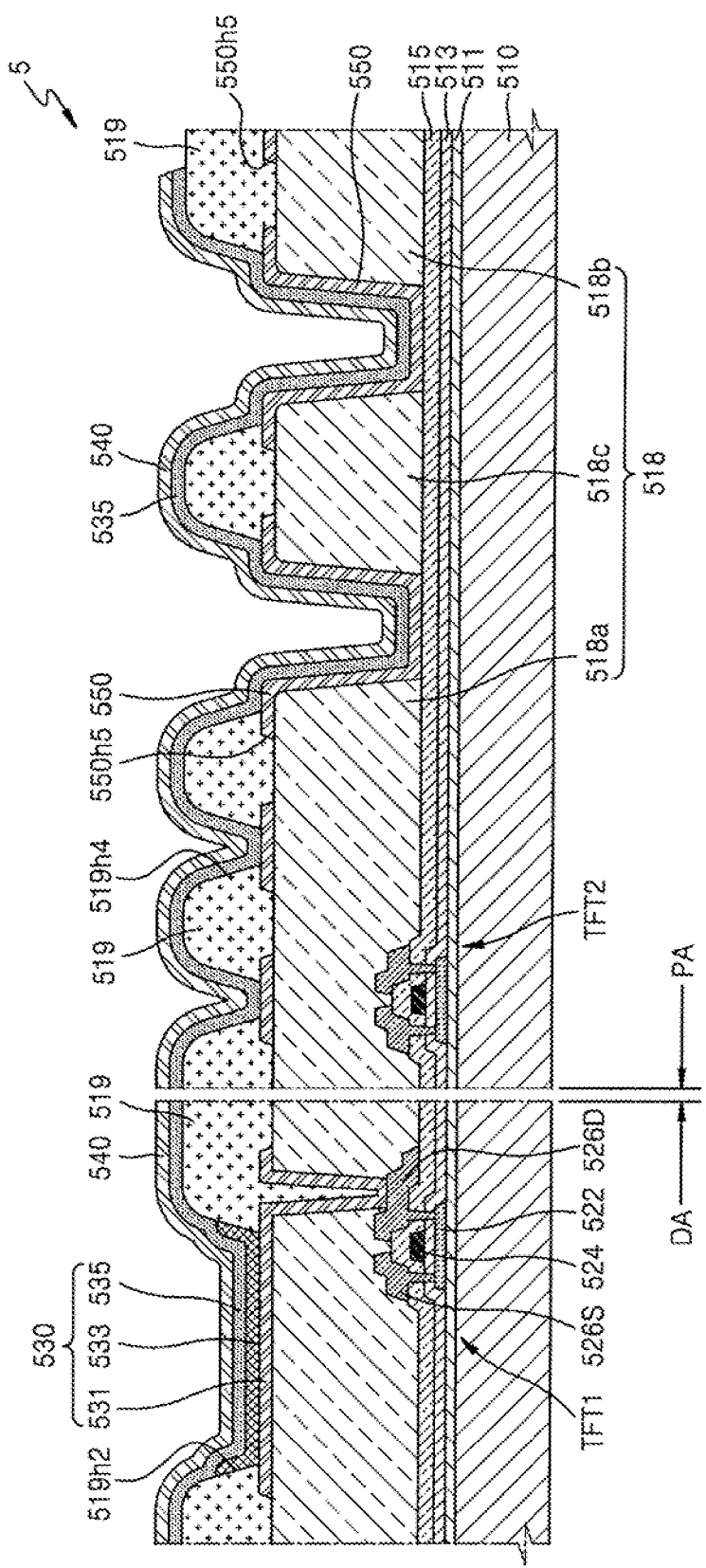
FIG. 8 is a schematic cross-sectional view illustrating an organic light-emitting display apparatus according to an exemplary embodiment of the present invention.

FIG. 8 is a schematic cross-sectional view illustrating an organic light-emitting display apparatus 5 according to an exemplary embodiment of the present invention.

Referring to FIG. 8, the organic light-emitting display apparatus 5 may include a substrate 510, a first insulating layer 518, a first electrode 531, a pixel defining film 519, an intermediate layer 533, and a second electrode 535. The substrate 510 may include a display area DA and a peripheral area PA outside the display area DA. The first insulating layer 518 may be arranged over the substrate 510 throughout the display area DA and the peripheral area PA. The first insulating layer 518 may include a first opening 518h1 in the peripheral area PA. The first electrode 531 may be arranged over the first insulating layer 518 in the display area DA. The pixel defining film 519 may be arranged over the first insulating layer 518 throughout the display area DA and the peripheral area PA. The pixel defining film 519 may include a second opening 519h2. The second opening 519h2 may expose a central portion of the first electrode 531. The pixel defining film 519 may also include a third opening 519h3 in which the first opening 518h1 is disposed. The intermediate layer 533 may be arranged over the first electrode 531. The second electrode 535 may cover the intermediate layer 533, the pixel defining film 519, the third opening 519h3, and the first opening 518h1.

A buffer layer 511 may be arranged over the substrate 510. A thin film transistor TFT1 and an organic light-emitting device 530 may be arranged over the buffer layer 511 in the display area DA. The organic light-emitting device 530 may be electrically connected to the thin film transistor TFT1. The organic light-emitting device 530 may include a first electrode 531, an intermediate layer 533, and a second electrode 535. The intermediate layer 533 may include an emission layer.

The thin film transistor TFT1 may include a semiconductor layer 522, a gate electrode 524, a source electrode 526S, and a drain electrode 526D. A gate insulating film 513 may be disposed between the semiconductor layer 522 and the gate electrode 524. A second insulating layer 515 may be arranged over the gate electrode 524. The gate insulating film 513 and the second insulating layer 515 may include an inorganic material. The gate insulating film 513 and the second insulating film 515 may be disposed throughout the display area DA and the peripheral area PA.

The first insulating layer 518 may be arranged over the thin film transistor TFT1. The first insulating layer 518 may be disposed throughout the display area DA and the peripheral area PA. The first insulating layer 518 may include a plurality of first openings 518h1a and 518h1b in the peripheral area PA. The plurality of first openings 518h1a and 518h1b may expose the second insulating layer 515. The plurality of openings 518h1a and 518h1b may be openings branched from one opening or may be openings completely separated from one another.

Due to the plurality of first openings 518h1a and 518h1b, the first insulating layer 518 may be divided into a first area 518a, a second area 518b, and a third area 518c. When the plurality of first openings 518h1a and 518h1b are openings branched from one opening, the third area 518c may have a rectangular shape. When the plurality of first openings 518h1 and 518h1b are openings completely separated from one another, the third area 518c may have a frame shape. The first insulating layer 518 may include an organic material such as polyimide (PI).

The first electrode 531 may be arranged over the first insulating layer 518 in the display area DA. A conductive layer 550 may be in the peripheral area PA. The conductive layer 550 may include a plurality of fifth openings 550h5. The plurality of fifth openings 550h5 may be arranged over the third area 518c, the first area 518a and the second area 518b of the first insulating layer 518. The pixel defining film 519 may be arranged over the first insulating layer 518. The pixel defining film 519 may include a plurality of fourth openings 519h4. The plurality of fourth openings 519h4 may expose at least a portion of the conductive layer 550.

The intermediate layer 533 including the emission layer (EML) may be arranged over the first electrode 531. The second electrode 535 may be arranged over the intermediate layer 533. The pixel defining film 519 may extend to the inside of the plurality of first openings 518h1a and 518h1b. Since the pixel defining film 519 might not be disposed inside the plurality of first openings 518h1a and 518h1b, the conductive layer 550 may contact the second electrode 535 in the plurality of first openings 518h1a and 518h1b. The conductive layer 550 may be a voltage supply line for supplying a voltage to the second electrode 535. Alternatively, the conductive layer 500 may be a connection line for connecting the voltage supply line to the second electrode 535. The second electrode 535 may completely cover the plurality of first openings 518h1a and 518h1b.

The first insulating layer 518 may include the plurality of first openings 518h1a and 518h1b. The second electrode 535 may completely cover the plurality of first openings 518h1a and 518h1b. Therefore, as compared with the first insulating layer 518 includes one first opening, it may be possible to more reliably block the passage through which impurities (e.g., gas or moisture) introduced from the outside through the pixel defining film 519 or generated in the pixel defining film 519 permeate the display area DA. Therefore, deterioration in image quality in the organic light-emitting apparatus 5 during a manufacturing process or in use may be prevented or reduced.

According to at least one embodiment of the present invention, an organic light-emitting display apparatus 1, 2, 3, 4, and 5 including the first insulating layer 118 218, 318, 418, and 518 including the first opening 118h1 218h1, 318h1, 418h1, 518h1a, and 518h1b may be in the peripheral area PA. The passage through which impurities may be introduced from the outside of the first opening 118h1 218h1, 318h1, 418h1, 518h1a, and 518h1b to the inside of the first opening 118h1 218h1, 318h1, 418h1, 518h1a, and 518h1b may be prevented. Therefore, deterioration in image quality in the organic light-emitting display apparatus 1 2, 3, 4, and 5 may be prevented or reduced.

It should be understood that embodiments of the present invention as described herein should be considered in a descriptive sense only and not for purposes of limitation. Descriptions of features or aspects within each embodiment of the present invention should typically be considered as available for other similar features or aspects in other embodiments of the present invention.

While one or more embodiments of the present invention have been described with reference to the figures, it will be understood by those of ordinary skill in the art that various changes in form and details may be made therein without departing from the spirit and scope as defined by the following claims.

What is claimed is:

1. An organic light-emitting display apparatus, comprising:
 a substrate having a display area and a peripheral area outside the display area;
 a first insulating layer arranged over the substrate throughout the display area and the peripheral area, the first insulating layer comprising a first opening disposed in the peripheral area;
 a first electrode arranged over the first insulating layer in the display area;
 a pixel defining film arranged over the first insulating layer, the pixel defining film comprising a second opening exposing a portion of the first electrode, and a third opening formed at the location of the first opening to form a common opening;
 an intermediate layer arranged over the first electrode; and
 a second electrode covering the intermediate layer, the pixel defining film, at least a portion of the third opening, and at least a portion of the first opening.

2. The organic light-emitting display apparatus of claim 1, further comprising a conductive layer arranged over the first insulating layer in the peripheral area, wherein the conductive layer covers the first opening.

3. The organic light-emitting display apparatus of claim 2, wherein
 the pixel defining film comprises a plurality of fourth openings over at least a portion of the conductive layer.

4. The organic light-emitting display apparatus of claim 3, wherein
 the second electrode contacts the conductive layer through the plurality of fourth openings.

5. The organic light-emitting display apparatus of claim 3, wherein
 the pixel defining film is divided into a plurality of areas by the plurality of fourth openings.

6. The organic light-emitting display apparatus of claim 2, wherein
 the conductive layer comprises a plurality of fifth openings disposed around the first opening.

7. The organic light-emitting display apparatus of claim 2, wherein
 the second electrode directly contacts the conductive layer disposed in the first opening.

8. The organic light-emitting display apparatus of claim 1, wherein
 a width of the third opening is greater than a width of the first opening.

9. The organic light-emitting display apparatus of claim 1, further comprising a second insulating layer arranged below the first insulating layer,
 wherein the second insulating layer comprises an inorganic material and the first opening extends to the second insulating layer.

10. The organic light-emitting display apparatus of claim 1, wherein
 the second electrode completely covers the third opening and the first opening.

11. The organic light-emitting display apparatus of claim 1, wherein
 the first opening surrounds the display area.

12. The organic light-emitting display apparatus of claim 11, wherein
 the first insulating layer is divided into a first area and a second area by the first opening.

13. The organic light-emitting display apparatus of claim 12, wherein
 the pixel defining film is divided into at least two areas by the third opening.

14. The organic light-emitting display apparatus of claim 11, wherein
 the first opening forms a closed loop, and
 the second electrode completely covers the first opening.

15. The organic light-emitting display apparatus of claim 14, wherein
 an edge of the second electrode is outside the first opening with respect to the display area, and
 a distance between the edge of the second electrode and the first opening in an area corresponding to a corner of the display area is less than a distance between the edge of the second electrode and the first opening in an area except for the area corresponding to the corner of the display area.

16. The organic light-emitting display apparatus of claim 14, wherein
 the closed loop comprises an area recessed toward the display area in an area corresponding to a corner of the display area.

17. The organic light-emitting display apparatus of claim 14, wherein
 the second electrode comprises an area protruding in a direction away from the display area in an area corresponding to a corner of the display area.

18. The organic light-emitting display apparatus of claim 1 further comprising a capping layer arranged over the second electrode and covering the first opening.

19. The organic light-emitting display apparatus of claim 18, wherein
 the capping layer is separated from the pixel defining film in the third opening by the second electrode.

20. The organic light-emitting display apparatus of claim 18, wherein
 each of the first insulating layer, the pixel defining film, and the capping layer comprises an organic material.

21. The organic light-emitting display apparatus of claim 18, further comprising an encapsulating layer arranged over the capping layer,
 wherein the encapsulating layer comprises at least one inorganic layer and at least one organic layer.

22. The organic light-emitting display apparatus of claim 1, wherein
 the first insulating layer comprises at least two first openings.

23. The organic light-emitting display apparatus of claim 22, wherein
 the first insulating layer comprises a first area, a second area, and a third area separated from one another by the at least two first openings.

* * * * *